(12) United States Patent
Nojioka

(10) Patent No.: US 6,333,471 B1
(45) Date of Patent: Dec. 25, 2001

(54) SHEET METAL COMPONENT FOR DOUBLE PATTERN CONDUCTION AND PRINTED CIRCUIT BOARD

(75) Inventor: Shinichi Nojioka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/441,203

(22) Filed: Nov. 16, 1999

(30) Foreign Application Priority Data

May 27, 1999 (JP) .................................................. 11-147820

(51) Int. Cl.[7] ............................... H01R 12/04; H05K 1/11
(52) U.S. Cl. ........................ 174/262; 174/261; 174/263; 174/265; 361/791; 361/792; 361/803
(58) Field of Search ..................................... 174/262, 260, 174/261, 263, 265, 266, 267, 68.1; 361/760, 791, 792, 793, 785, 803, 807, 808, 809, 810

(56) References Cited

U.S. PATENT DOCUMENTS 3,230,297 * 1/1966 Means .................................. 174/262
5,281,770 * 1/1994 Kamei et al. ......................... 174/261
5,860,817 * 1/1999 Fieberling et al. ...................... 439/81
6,172,306 * 1/2001 Downey ................................ 174/261

FOREIGN PATENT DOCUMENTS

| 52-118263 | 10/1977 | (JP) . |
| 55-70093 | 5/1980 | (JP) . |
| 55-108792 | 8/1980 | (JP) . |
| 401260885A | * 10/1989 | (JP) . |
| 410190179A | * 7/1998 | (JP) . |
| 410190180A | * 7/1998 | (JP) . |

* cited by examiner

Primary Examiner—Jeffrey Gaffin
Assistant Examiner—I B Patel
(74) Attorney, Agent, or Firm—Birch, Stewart, Kolasch & Birch, LLP

(57) ABSTRACT

A sheet metal component (8) for pattern conduction comprises a lead portion (8a) that is connected to an end portion of a first portion (8c1) of a ceiling portion (8c) by a coupling portion (8d) forming a first bend (R1); and a portion to be soldered (8b) that is bent inwardly from an end portion (8c2E, 8c3E) of a longitudinally protruding second portion (8c2, 8c3) of the ceiling portion (8c), which is connected to the first portion (8c1), so as to form a second bend (R2).

5 Claims, 3 Drawing Sheets

SHEET METAL COMPONENT FOR DOUBLE PATTERN CONDUCTION AND PRINTED CIRCUIT BOARD

BACKGROUND OF THE INVENTION

The present invention relates to a technique for manufacturing a double-sided printed circuit board for use in electronic equipment, especially to a technique for improving the construction of a sheet metal component for double pattern conduction to be used in the manufacture of a printed circuit board.

DESCRIPTION OF THE BACKGROUND ART

FIG. 3 is a perspective view of a publicly-unknown conventional sheet metal component 9 for double pattern conduction (hereinafter referred to as a conventional sheet metal component) which is used to establish connection between patterns on both sides of a printed circuit board. FIG. 4 is a longitudinal cross-sectional view of the component 9 mounted on a printed circuit board.

In FIGS. 3 and 4, the reference 1 designates a printed circuit board (PCB); 1a designates a base material; 2 designates solder; 3 designates a solder resist; 4 designates an A-plane pattern of the PCB 1; 5 designates a B-plane pattern of the PCB 1; 6 designates a through hole in the PCB 1; 7 designates cream solder; 9c designates a ceiling portion of the conventional sheet metal component 9; 9b designates a surface portion to be soldered which is bent inwardly from the end of the ceiling portion 9c so as to form a bend R1 and further extends to face the ceiling portion 9c; and 9a designates a lead portion which protrudes downwardly from the surface portion 9b.

Now the action of the sheet metal component 9 will be described.

As a way for establishing connection between patterns on both sides of a printed circuit board which forms a predetermined circuit, there have been proposed methods of (1) plating through holes with copper; (2) filling through holes with silver pastes for hardening; (3) inserting and caulking eyelets for soldering; and (4) inserting jumpers for soldering; however, each method has a problem. In the prior art methods (1) and (2), a substrate becomes costly because of the necessity of processing on the substrate. The methods (3) and (4), on the other hand, are free from such a cost problem, but thermal expansion or contraction of the PCB due to environmental temperature changes during device operation tends to cause stress cracking at solder joints.

The method of manufacturing a printed circuit board shown in FIGS. 3 and 4 is devised to resolve such problems simultaneously.

First, the cream solder 7 is printed on the A-plane pattern 4 of the printed circuit board 1 by a cream-solder printing machine. Then, the sheet metal component 9 for double pattern conduction in FIG. 3 is mounted on the cream solder 7 by general-purpose surface-mount-component placement equipment. At this time, the lead portions 9a of the conventional sheet metal component 9 are inserted into the through hole 6 in the printed circuit board 1, and their respective end portions slightly protrude from the B plane. During the same process, other surface-mount electronic components are also mounted on corresponding patterns.

The surface portions 9b of the conventional sheet metal component 9 on the side of the A plane are then soldered to the A-plane pattern 4 by melting the cream solder 7 using a reflow device. The mounting described so far is feasible with a series of surface-mount line processes which would not increase in complexity. Besides, the use of the surface-mount-component placement equipment for mounting prevents scattering of unmolten cream solder 7.

Next, through-hole-mount components are inserted into corresponding through holes. Then, the through-hole-mount components and the end portions of the respective lead portions 9a which protrude from the conventional sheet metal component 9 are soldered to the B-plane pattern 5 by a flow soldering device. At this time, capillary action of solder causes solder wicking in between the two opposing lead portions 9a of the conventional sheet metal component 9, resulting in an increase in the volume of the lead portions 9a by the amount of solder wicking. Thus, the allowed value for current slightly increases.

When this printed circuit board 1 is integrated into electronic equipment, the base material 1a of the printed circuit board 1 undergoes continuous temperature changes due to environmental temperature changes in starting or stopping the electronic equipment; consequently, stress such as contraction occurs in the material 1a, causing a problem of cracking of solder at the solder joints. The conventional sheet metal component 9 in FIG. 3, however, can prevent such occurrence of cracking of solder because it can distribute the stress at its bends R1.

As above described, the conventional sheet metal component 9 with the construction in FIG. 3 achieves several effects: high packing density, low cost, and the prevention of cracking of solder. The component 9, however, may be mounted nearly in close contact with the printed circuit board 1 as shown in FIG. 4 and it may fail to completely distribute the stress at its bends R1 because of high rigidity of the bends R1 due to large ceiling and surface areas 9c, 9b. Further, a distance between the solder joints on the A, B planes may be relatively short from a viewpoint of stress distribution. Therefore, the conventional sheet metal component 9 still carries a problem of the impracticability of completely distributing the stress.

For these reasons, even if both patterns are brought into conduction with the conventional sheet metal component 9 in FIG. 3, there remains not a small probability that stress will be focused on a portion between the solder joints and thereby cause cracking of solder at the joints.

SUMMARY OF THE INVENTION

A first aspect of the present invention is directed to a sheet metal component for double pattern conduction, for establishing connection between a first plane pattern and a second plane pattern provided on first and second planes of a printed circuit board, respectively. The sheet metal component comprises: a lead portion; a coupling portion; a ceiling portion having a first portion and a second portion connected to the first portion; and a portion to be soldered, having a surface to be soldered which is parallel to the first plane and an end portion that can be soldered to the first plane pattern through the surface to be soldered, wherein the lead portion, the coupling portion, the ceiling portion, and the portion to be soldered are integrated; the lead portion is shaped and sized to be inserted into a through hole passing through the printed circuit board, with its end portion protruding from the second plane; the end portion of the lead portion is made of a material that can be soldered to the second plane pattern after the lead portion is inserted into the through hole; the lead portion is connected to the first portion of the ceiling portion by the coupling portion that is bent inwardly in the middle to form a first bend; the portion to be soldered is bent inwardly from an end portion of the second portion of the ceiling portion to form a second bend and further extends to face the second portion; and a height from the ceiling portion to the portion to be soldered is greater than a height from the ceiling portion to the coupling portion.

According to a second aspect of the present invention, in the sheet metal component for double pattern conduction according to the first aspect, the first portion is located in the center of the ceiling portion; the second portion corresponds to one side portion of the ceiling portion which extends longitudinally beyond the first portion; and a width of the end portion of the portion to be soldered is equivalent to a width of the second portion.

A third aspect of the present invention is directed to a printed circuit board comprising: a base material; a first plane pattern provided on a first plane of the base material; a second plane pattern provided on a second plane of the base material; a through hole passing through the first plane pattern, the base material, and the second plane pattern; and the sheet metal component for double pattern conduction according to the first aspect, wherein the lead portion is inserted into the through hole; the end portion of the lead portion and the end portion of the portion to be soldered are soldered to the second plane pattern and the first plane pattern, respectively; and there is continuity between the first plane pattern and the second plane pattern.

A fourth aspect of the present invention is directed to a printed circuit board comprising: a base material; a first plane pattern provided on a first plane of the base material; a second plane pattern provided on a second plane of the base material; a through hole passing through the first plane pattern, the base material, and the second plane pattern; and the sheet metal component for double pattern conduction according to the second aspect, wherein the lead portion is inserted into the through hole; the end portion of the lead portion and the end portion of the portion to be soldered are soldered to the second plane pattern and the first plane pattern, respectively; and there is continuity between the first plane pattern and the second plane pattern.

A fifth aspect of the present invention is directed to a sheet metal component for double pattern conduction, for establishing connection between a first plane pattern and a second plane pattern provided on first and second planes of a printed circuit board, respectively. The sheet metal component comprises: lead means; coupling means; ceiling means having a first portion and a second portion connected to the first portion; and means to be soldered, having a surface to be soldered which is parallel to the first plane and an end portion that can be soldered to the first plane pattern through the surface to be soldered, wherein the lead means, the coupling means, the ceiling means, and the means to be soldered are integrated; the lead means can be inserted into a through hole passing through the printed circuit board, with its end portion protruding from the second plane; the end portion of the lead means can be soldered to the second plane pattern after the lead means is inserted into the through hole; the lead means is connected to the first portion of the ceiling means by the coupling means that is bend inwardly in the middle to form first bent means; the means to be soldered is bend inwardly from an end portion of the second portion of the ceiling means to form second bent means and further extends to face the second portion; and a height from the ceiling means to the means to be soldered is greater than a height from the ceiling means to the coupling means.

In the aforementioned aspects of the present invention, stress at solder joints that is caused for example by thermal contraction of the printed circuit board associated with environmental temperature changes can effectively be distributed; therefore, no cracking occurs at the solder joints. Besides, continuity established between the first plane pattern and the second plane pattern through the use of the sheet metal component for double pattern conduction allows the manufacture of a highly reliable, low-cost, high-density printed circuit board.

An object of the present invention is to improve the construction of a conventional sheet metal component to achieve a highly reliable, low-cost, high-density printed circuit board.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment

Figure 1:
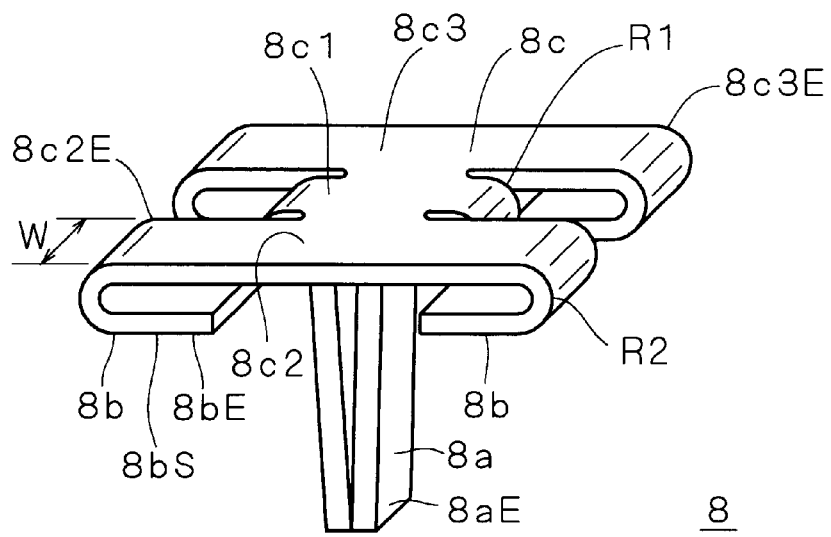
FIG. 1 is a perspective view showing an example of a sheet metal component for double pattern conduction according to a preferred embodiment of the present invention.

Referring now to the drawings, we will describe the construction of a sheet metal component for double pattern conduction and the construction of a double-sided printed circuit board using the sheet metal component, according to a preferred embodiment of the present invention.

Figure 2:
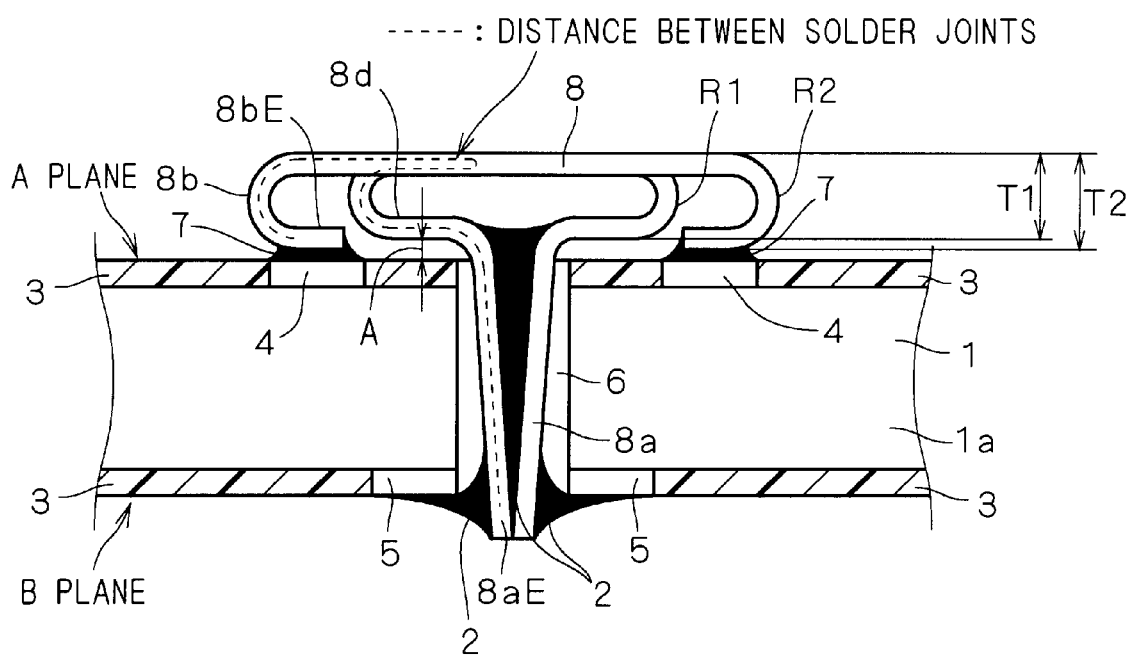
FIG. 2 is a longitudinal cross-sectional view of a printed circuit board and a sheet metal component for double pattern conduction which is soldered to the circuit by surface mounting technology, according to the preferred embodiment of the present invention.

FIG. 1 is a perspective view showing the construction of a sheet metal component for double pattern conduction 8 (hereinafter referred to as a new sheet metal component) according to the present invention. FIG. 2 is a longitudinal cross-sectional view showing, as an example, the construction of the surface-mounted new sheet metal component 8 and the construction of a printed circuit board (PCB) 1 with its patterns on both sides brought into conduction with the component 8. In FIGS. 1 and 2, like parts are identified by the same reference characters as in FIGS. 3 and 4. Specifically, the reference 1*a* designates a base material of the PCB 1; 2 designates solder; 3 designates a solder resist; 4 designates a A-plane pattern; 5 designates a B-plane pattern; 6 designates a through hole in the PCB 1; and 7 designates cream solder.

In FIGS. 1 and 2, the new sheet metal component 8 is broadly divided into (1) lead portions 8*a*; (2) coupling portions 8*d*; (3) a ceiling portion 8*c*; and (4) portions to be soldered 8*b*, all of which are integrated. The details of each portion are as follows.

The two lead portions 8*a*, opposed to each other, are plate portions that extend diagonally and downwardly so as to show a V-shaped section (cf. FIG. 2). They have a common length enough to have their respective end portions 8aE slightly protruding from the B plane (corresponding to a second plane) of the printed circuit board 1 and are shaped to be inserted into the through hole 6 passing through the A plane (corresponding to a first plane) and B plane of the printed circuit board 1. Conversely, the through hole 6 is previously formed in the printed circuit board 1 so that the lead portions 8a can be inserted therein.

Figure 4:
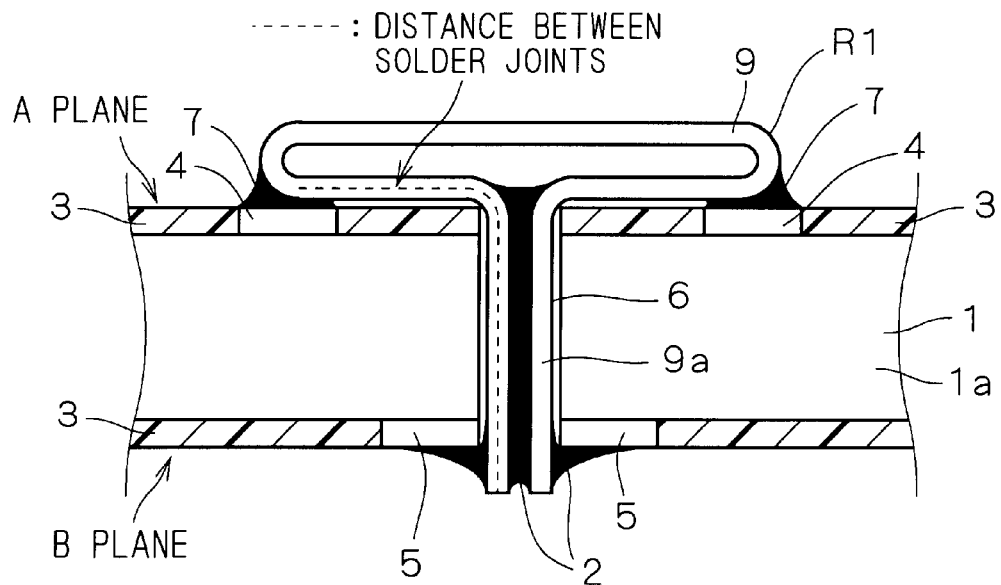
FIG. 4 is a longitudinal cross-sectional view of a conventional printed circuit board and a sheet metal component for double pattern conduction which is soldered to the circuit.

One end portion of the coupling portion 8d is connected to the other end portion of the lead portion 8a, and the other end portion of the coupling portion 8d is connected to the end portion of a central portion (corresponding to a first portion) 8c1 of the ceiling portion 8c. That is, the coupling portion 8d, forming a first bend R1, serves as a coupling between the other end portion of the lead portion 8a and the first portion 8c1 of the ceiling portion 8c. The presence of the coupling portion 8d prevents direct connection of the other end portion of the lead portion 8a to the A-plane pattern (corresponding to a first plane pattern) 4 as shown in FIG. 4.

The ceiling portion 8c is broadly divided into (i) the first portion 8c1; and (2) two second portions 8c2, 8c3 each connected to each longitudinal side edge of the first portion 8c1. The second portions 8c2 and 8c3 correspond to side portions of the ceiling portion 8c each extending longitudinally beyond the ends of the first portion 8c1.

Each of the four portions 8b to be soldered is bent inwardly from an end portion 8c2E, 8c3E of a corresponding second portion 8c2, 8c3 of the ceiling portion 8c to form a second bend R2, and further extends in parallel with the A plane (first plane) of the printed circuit board 1 so that a surface to be soldered 8bS of its end portion 8bE is opposed to a surface of the protrusive portion of the corresponding second portion 8c2, 8c3. The end portion 8bE of the portion 8b is, as described below, soldered to the A-plane pattern 4. The shape and size of the portions 8b and 8d are designed so that a height T2 from an upper surface of the ceiling portion 8c to the surface 8bS of the portion 8b is greater than a height T1 from the upper surface of the ceiling portion 8c to the outer surface (i.e., surface opposed to the A plane of the printed circuit board 1) of the coupling portion 8d. In addition, the width of the end portion 8bE of the portion 8b in a direction orthogonal to the longitudinal direction, corresponds to the width W of the second portions 8c2, 8c3.

Figure 5:
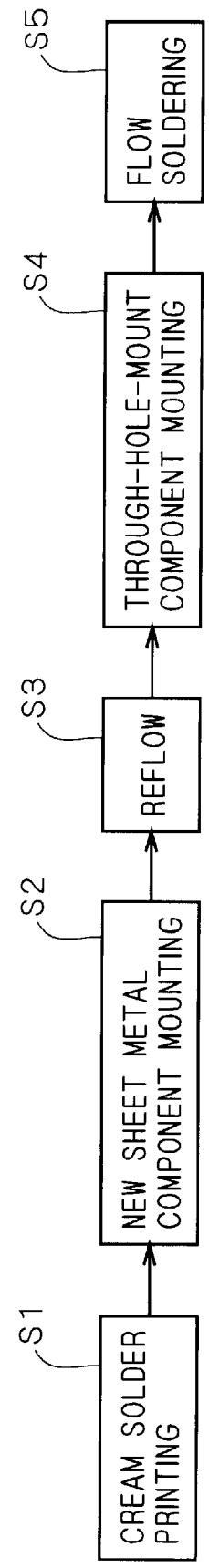
FIG. 5 shows a process of manufacturing a double-sided printed circuit board according to the present invention.

Referring now to FIGS. 2 and 5, we will describe high-density packaging (i.e., a method of manufacturing a double-sided printed circuit board) achieved by establishing connection between patterns on both sides of the printed circuit board with the new sheet metal component 8 having the construction shown in FIGS. 1 and 2.

First, the cream solder 7 is printed on the A-plane pattern of the printed circuit board 1 by a cream-solder printing machine (step S1). Then, the new sheet metal component 8 is mounted on the cream solder 7 printed on the A-plane pattern 4, by general-purpose surface-mount-component placement equipment (step S2). At this time, the lead portions 8a protruding from the ceiling portion 8c of the new sheet metal component 8 are inserted into the through hole 6 in the printed circuit board 1, and their respective end portions 8aE slightly protrude from the B plane. During the same process, other surface-mount electronic components are also mounted.

The end portions 8bE of the portions 8b of the new sheet metal component 8 are then soldered to the A-plane pattern 4 by melting the cream solder 7 using a reflow device (step S3). The mounting described so far is feasible with a series of surface-mount line processes which would not increase in complexity. Besides, the use of the general-purpose surface-mount-component placement equipment for mounting each surface-mount component prevents scattering of unmolten cream solder 7.

Next, through-hole-mount components are inserted into corresponding through holes previously provided in the printed circuit board 1 (step S4). Then, the through-hole-mount components and the end portions 8aE of the lead portions 8a which protrude form the new sheet metal component 8 are soldered to the B-plane pattern (corresponding to a second plane pattern) 5 by a flow soldering device (step S5). At this time, capillary action of solder causes solder wicking in between the two opposing lead portions 8a of the new sheet metal component 8, resulting in an increase in the volume of the lead portions by the amount of solder wicking. Thus, the allowed value for current slightly increases.

Figure 3:
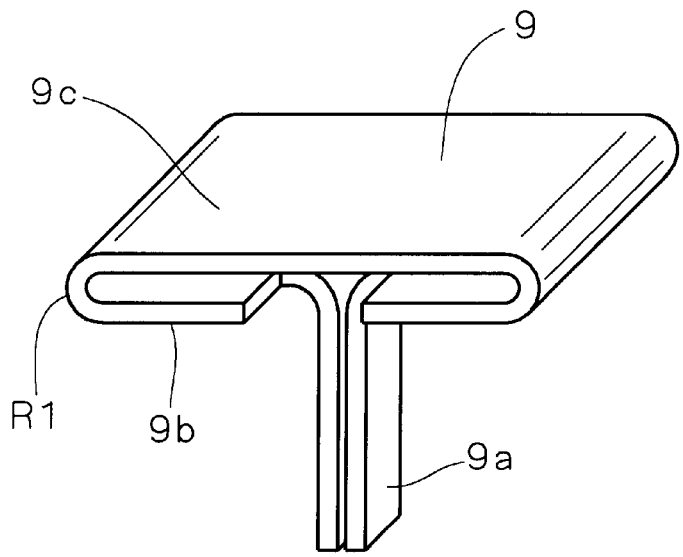
FIG. 3 is a perspective view showing an example of a conventional sheet metal component for double pattern conduction.

The aforementioned process of mounting the new sheet metal component 8 on the printed circuit board 1 is basically identical to the process for the conventional sheet metal component 9 shown in FIGS. 3 and 4.

With the following features, the new sheet metal component 8 can effectively prevent the still-unresolved problems of the conventional sheet metal component 9 that the stress such as contraction associated with continuous temperature changes occurring in the base material 1a of the printed circuit board 1 is centered on the solder joints, thereby causing cracking at the joints.

Feature 1: A distance between the solder joints on the A-plane pattern 4 and the B-plane pattern 5 is set longer than in the conventional sheet metal component 9. It can be seen from a comparison between a distance indicated by the dotted line in FIG. 2 and that in FIG. 4.

Feature 2: The end portions of the lead portions 8a, connected to the ceiling portion 8c of the new sheet metal component 8 via the coupling portion 8d, are free of the A plane of the printed circuit board 1 (cf. a space A in FIG. 2).

Feature 3: A portion of the ceiling portion 8c which is be soldered to the A-plane pattern 4, i.e., the surface 8b S of the portion 8b, is narrowed as compared to the surface 9b to be soldered in FIG. 3 (9b is completely soldered to the A-plane pattern) to thereby degrade rigidity.

With these features 1 to 3, stress such as contraction associated with continuous temperature changes occurring in the base material 1a of the printed circuit board 1 can be distributed among the path between the solder joints on the A, B planes (the dotted line in FIG. 2), especially among the two bends R1 and R2. This prevents concentration of the stress at the solder joints (in FIG. 2, the cream solder 7 on the A plane and the solder 2 on the B plane), thereby preventing the occurrence of cracking of solder.

While the invention has been shown and described in detail, the foregoing description is in all aspects illustrative and not restrictive. It is therefore understood that numerous modifications and variations can be devised without departing from the scope of the invention.

What is claimed is:

1. A sheet metal component for double pattern conduction, for establishing connection between a first plane pattern and a second plane pattern provided on first and second planes of a printed circuit board, respectively, comprising:

a lead portion;

a coupling portion;

a ceiling portion having a first portion and a second portion connected to said first portion; and a portion to be soldered, having a surface to be soldered which is parallel to said first plane and an end portion that can be soldered to said first plane pattern through said surface to be soldered, wherein said lead portion, said coupling portion, said ceiling portion, and said portion to be soldered are integrated;

wherein said lead portion is shaped and sized to be inserted into a through hole passing through said printed circuit board, with its end portion protruding from said second plane;

wherein said end portion of said lead portion is made of a material that can be soldered to said second plane pattern after said lead portion is inserted into said through hole;

wherein said lead portion is connected to said first portion of said ceiling portion by said coupling portion that is bent inwardly in the middle to form a first bend;

wherein said portion to be soldered is bent inwardly from an end portion of said second portion of said ceiling portion to form a second bend and further extends to face said second portion; and wherein a height from said ceiling portion to said portion to be soldered is greater than a height from said ceiling portion to said coupling portion.

2. The sheet metal component for double pattern conduction according to claim 1, wherein said first portion is located in the center of said ceiling portion;

said second portion corresponds to one side portion of said ceiling portion which extends longitudinally beyond said first portion; and a width of said end portion of said portion to be soldered is equivalent to a width of said second portion.

3. A printed circuit board comprising:

a base material;

a first plane pattern provided on a first plane of said base material;

a second plane pattern provided on a second plane of said base material;

a through hole passing through said first plane pattern, said base material, and said second plane pattern; and said sheet metal component for double pattern conduction according to claim 1, wherein said lead portion is inserted into said through hole;

said end portion of said lead portion and said end portion of said portion to be soldered are soldered to said second plane pattern and said first plane pattern, respectively; and there is continuity between said first plane pattern and said second plane pattern.

4. A printed circuit board comprising:

a base material;

a first plane pattern provided on a first plane of said base material;

a second plane pattern provided on a second plane of said base material;

a through hole passing through said first plane pattern, said base material, and said second plane pattern; and said sheet metal component for double pattern conduction according to claim 2, wherein said lead portion is inserted into said through hole;

said end portion of said lead portion and said end portion of said portion to be soldered are soldered to said second plane pattern and said first plane pattern, respectively; and there is continuity between said first plane pattern and said second plane pattern.

5. A sheet metal component for double pattern conduction, for establishing connection between a first plane pattern and a second plane pattern provided on first and second planes of a printed circuit board, respectively, comprising:

lead means;

coupling means;

ceiling means having a first portion and a second portion connected to said first portion; and means to be soldered, having a surface to be soldered which is parallel to said first plane and an end portion that can be soldered to said first plane pattern through said surface to be soldered, wherein said lead means, said coupling means, said ceiling means, and said means to be soldered are integrated;

wherein said lead means can be inserted into a through hole passing through said printed circuit board, with its end portion protruding from said second plane;

wherein said end portion of said lead means can be soldered to said second plane pattern after said lead means is inserted into said through hole;

wherein said lead means is connected to said first portion of said ceiling means by said coupling means that is bend inwardly in the middle to form first bent means;

wherein said means to be soldered is bend inwardly from an end portion of said second portion of said ceiling means to form second bent means and further extends to face said second portion; and wherein a height from said ceiling means to said means to be soldered is greater than a height from said ceiling means to said coupling means.

* * * * *